United States Patent
Cen et al.

(10) Patent No.: US 12,014,956 B2
(45) Date of Patent: Jun. 18, 2024

(54) TUNGSTEN GAPFILL USING MOLYBDENUM CO-FLOW

(71) Applicant: Applied Materials, Inc., Santa Clara, CA (US)

(72) Inventors: Xi Cen, San Jose, CA (US); Kai Wu, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 261 days.

(21) Appl. No.: 17/488,275

(22) Filed: Sep. 28, 2021

(65) Prior Publication Data
US 2023/0109501 A1  Apr. 6, 2023

(51) Int. Cl.
| H01L 21/768 | (2006.01) |
| C23C 16/08 | (2006.01) |
| C23C 16/52 | (2006.01) |
| H01L 23/532 | (2006.01) |

(52) U.S. Cl.
CPC ........ *H01L 21/76877* (2013.01); *C23C 16/08* (2013.01); *C23C 16/52* (2013.01); *H01L 21/76843* (2013.01); *H01L 21/76876* (2013.01); *H01L 23/53266* (2013.01)

(58) Field of Classification Search
None
See application file for complete search history.

(56) References Cited

U.S. PATENT DOCUMENTS

| 6,352,916 | B1* | 3/2002 | Tang | H01L 21/76897 257/E21.585 |
| 9,859,157 | B1* | 1/2018 | Murray | H01L 21/76864 |
| 2009/0236745 | A1 | 9/2009 | Vrtis et al. | |
| 2014/0030889 | A1* | 1/2014 | Chen | H01L 21/76861 257/E21.584 |
| 2017/0084486 | A1 | 3/2017 | Zope et al. | |
| 2017/0350013 | A1* | 12/2017 | Chan | C23C 16/45551 |
| 2018/0312966 | A1 | 11/2018 | Chan et al. | |
| 2019/0067095 | A1 | 2/2019 | Zhu et al. | |
| 2019/0371662 | A1 | 12/2019 | Chen et al. | |
| 2020/0258747 | A1 | 8/2020 | Narushima et al. | |
| 2020/0365456 | A1 | 11/2020 | Thombare et al. | |

FOREIGN PATENT DOCUMENTS

WO   WO-2022182641 A1 *  9/2022

OTHER PUBLICATIONS

PCT International Search Report and Written Opinion in PCT/US2022/035401 dated Oct. 25, 2022, 11 pages.

* cited by examiner

*Primary Examiner* — Bradley Smith
(74) *Attorney, Agent, or Firm* — Servilla Whitney LLC

(57) ABSTRACT

Some embodiments of the disclosure relate to methods for forming a bottom-up tungsten gapfill. Some embodiments of the disclosure relate to methods for reducing the deposition rate of tungsten by chemical vapor deposition. A molybdenum halide precursor is added to a tungsten halide precursor and a reductant. The co-flow of tungsten halide and molybdenum halide demonstrates either reduced or eliminated tungsten growth.

12 Claims, 3 Drawing Sheets

TUNGSTEN GAPFILL USING MOLYBDENUM CO-FLOW

TECHNICAL FIELD

Embodiments of the disclosure generally relate to methods for depositing tungsten. In particular, embodiments of the disclosure pertain to methods for depositing tungsten gapfill in high aspect ratio features.

BACKGROUND

Gapfill process are integral to several semiconductor manufacturing processes. A gapfill process can be used to fill a gap (or feature) with an insulating or conducting material. For example, shallow trench isolation, inter-metal dielectric layers, passivation layers, dummy gate, etc.

As device geometries continue to shrink (e.g., critical dimensions <20 nm, <10 nm, and beyond) and thermal budgets are reduced, defect-free filling of spaces becomes increasingly difficult due to the limitations of conventional deposition processes.

Most conventional deposition methods deposit more material in upper regions of substrate features than on in lower regions, near the bottom of a structure. The process often forms a mushroom shape film profile at the substrate surface.

As a result, the film near the upper part of the feature may pinch off prematurely leaving seams or voids within the structure's lower region. This problem is more prevalent in features with small openings and high aspect ratios. Several methods have been proposed to resolve this issue.

First, some methods utilize a dep-etch processes. These methods require alternating deposition and etch modes which each require different reactants and process conditions. Accordingly, these methods suffer from lower throughput as they require additional processing time.

Second, some methods utilize a poisoning treatment. These methods may rely on radical treatments or utilize chemical inhibitors. Regardless, these treatments can alter the physical properties of the deposited film, specifically they may increase film resistivity.

Accordingly, there is a need for gapfill methods which allow for greater throughput without significant resistivity penalty.

SUMMARY

One or more embodiments of the disclosure are directed to a method of forming bottom-up tungsten gapfill. The method comprises simultaneously exposing a substrate with a feature therein to flows of a tungsten halide, a molybdenum halide and a reductant. The feature is defined by a depth from a top surface of the substrate to a bottom and width between two sidewalls, and tungsten is formed on the bottom without substantial deposition on the top surface of the substrate.

Additional embodiments of the disclosure are directed to a method of reducing the deposition rate of tungsten. The method comprising adding a flow of a molybdenum halide to a tungsten CVD process comprising a flow of a tungsten halide and a reductant.

BRIEF DESCRIPTION OF THE DRAWINGS

So that the features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
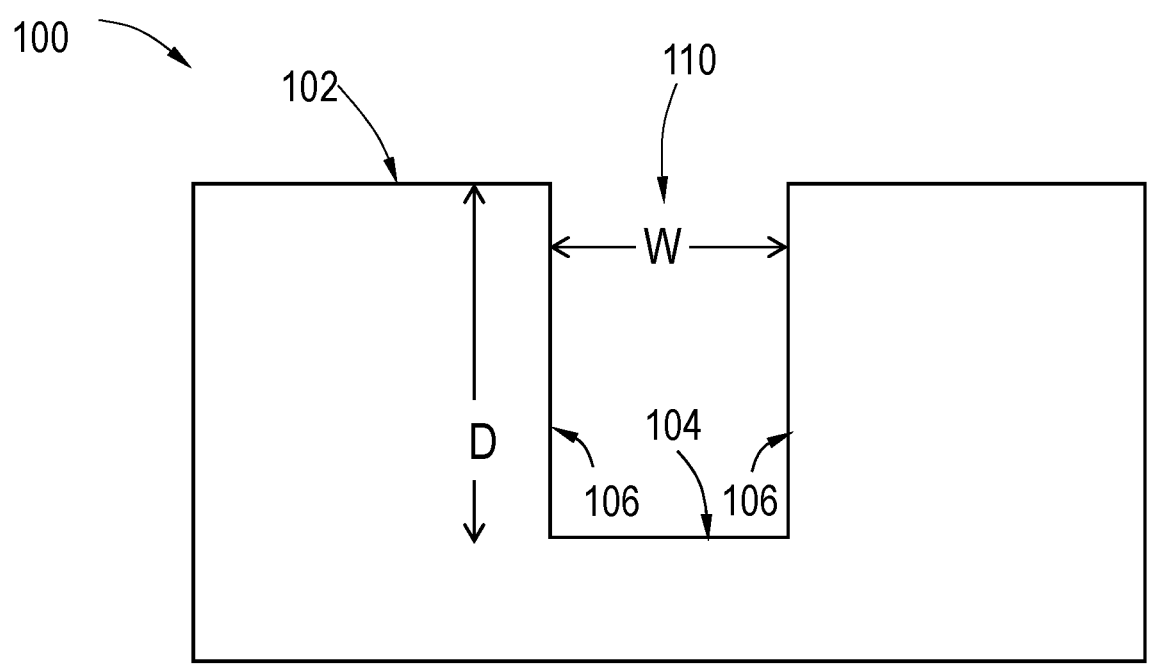
FIG. 1 shows a cross-sectional view of an exemplary substrate according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

One or more embodiments of the disclosure are directed to methods of forming a bottom-up tungsten gapfill. Additional embodiments of the disclosure are directed to methods of reducing the deposition rate of tungsten.

Some embodiments of the disclosure advantageously provide methods of forming tungsten gapfill within a feature having a narrow profile where the gapfill does not pinch off or close the opening of the feature. Some embodiments of the disclosure advantageously provide methods of forming tungsten gapfill without substantial deposition on the top surface of the substrate outside of the feature. Some embodiments of the disclosure advantageously provide methods of forming tungsten gapfill without the use of a separate etch process.

The inventors have surprisingly found that the inclusion of a molybdenum halide precursor in a tungsten CVD process unexpectedly reduces the deposition rate of tungsten. In some embodiments, the addition of the molybdenum halide precursor reduces the deposition rate of tungsten. In some embodiments, the addition of the molybdenum halide precursor reduces the deposition rate of tungsten by greater than or equal to 10%, greater than or equal to 20%, greater than or equal to 50%, or greater than or equal to 80%. In some embodiments, the addition of the molybdenum halide precursor eliminates the deposition of tungsten.

Embodiments of the disclosure may be understood with reference to the Figures. FIG. 1 shows an exemplary substrate for process according to one or more embodiment of the disclosure. A substrate 100 has a top surface 102. In some embodiments, the substrate 100 has at least one feature 110 formed therein. The at least one feature 110 of some embodiments has a width W between two sidewalls 106 and a depth D from the top surface 102 to a bottom 104.

The feature 110 may be any suitable dimensions. In some embodiments, the width of the feature is in a range of 50 nm to 500 nm. In some embodiments, the width of the feature is 300 nm. In some embodiments, the depth of the feature is in a range of 100 nm to 10 microns, or in a range of 1 micron to 10 microns. In some embodiments, the depth of the feature is 8 microns. In some embodiments, the In some embodiments, the at least one feature has an aspect ratio (D/W) of greater than or equal to 3:1, 5:1, 10:1, 15:1, 20:1, 25:1 or 30:1.

In some embodiments, the tungsten gapfill is formed within the at least one feature without any substantial void. In this regard a "substantial" void is greater than or equal to 1 nm in width. In some embodiments, the tungsten gapfill is formed within the at least one feature without any substantial seam. In this regard a "substantial" seam is less than or equal to 1 nm in width.

Without being bound by theory it is believed that atomic layer deposition (ALD) methods form seams within the gapfill material when the material, grown from each sidewall, meets near the center of the feature.

Figure 2:
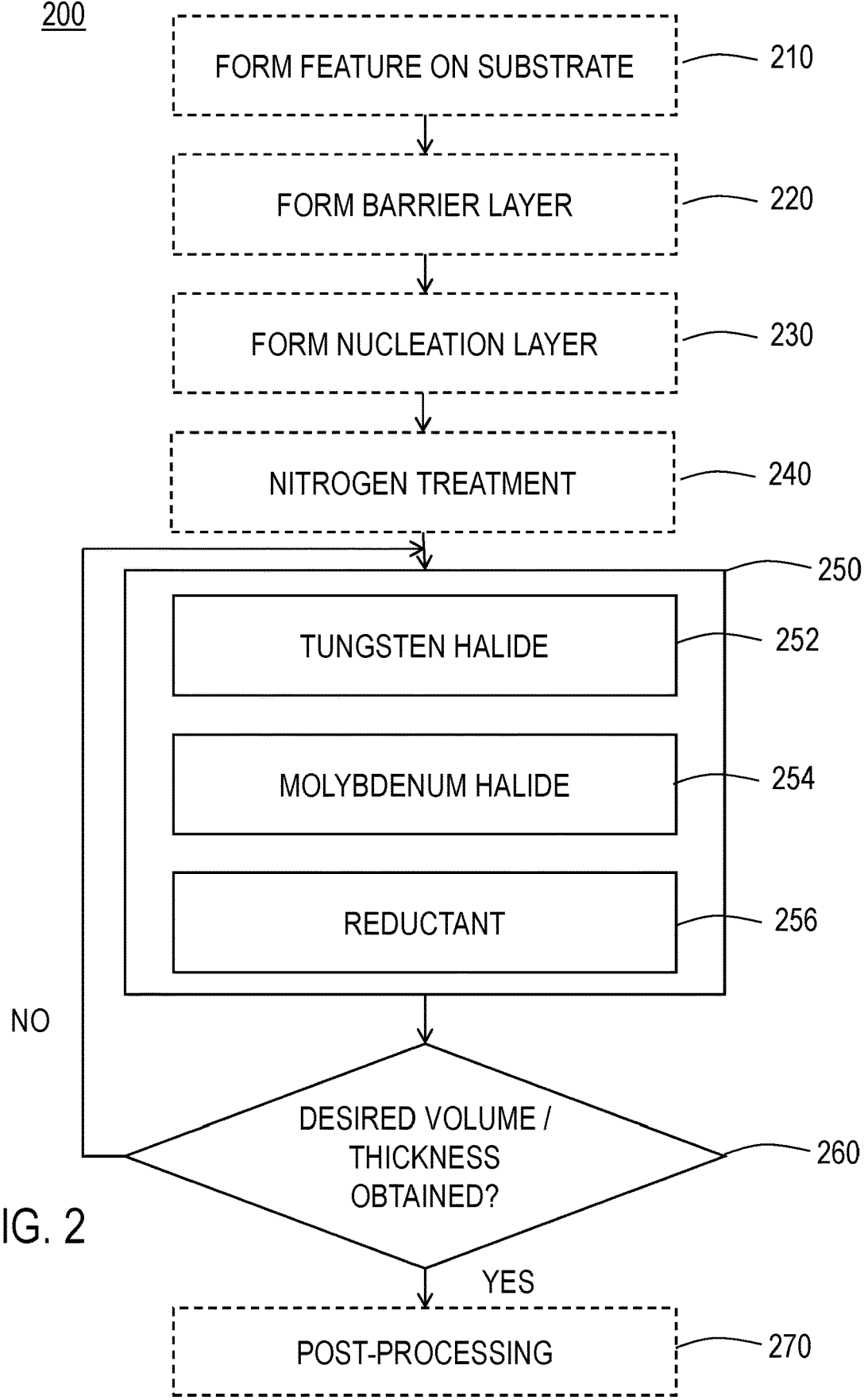
FIG. 2 illustrates a flow chart of a processing method according to one or more embodiment of the disclosure.

Referring to FIG. 2, in one or more embodiment, a method 200 may begin at 210 by forming the feature 110. The feature 110 may be formed by any suitable means including, but not limited to, photolithography, additive manufacturing, selective deposition and/or selective etching.

In some embodiments, the method 200 continues with optional operation 220. At operation 220, a barrier layer is formed on the feature 110. The barrier layer helps prevent diffusion of the tungsten gapfill material into the substrate. In some embodiments, the barrier layer is conformal to the shape of the feature. In some embodiments, the barrier layer is formed by atomic layer deposition. In some embodiments, the barrier layer comprises TiN.

In some embodiments, the method 200 continues with optional operation 230. At operation 230, a nucleation layer is formed on the feature 110. In some embodiments, the nucleation layer comprises tungsten and may be referred to as a tungsten nucleation layer. The nucleation layer helps promote deposition of the tungsten gapfill material on the feature 110. In some embodiments, the nucleation layer is deposited by sequentially exposing (ALD) the feature to $WF_6$ and a reductant comprising one or more of $B_2H_6$, $SiH_4$, or $H_2$. In some embodiments, the nucleation layer is further formed by a tungsten CVD process comprising $WF_6$ and $H_2$. In some embodiments, the nucleation layer is deposited by a tungsten physical vapor deposition (PVD) process. In some embodiments, the nucleation layer is conformal to the shape of the feature.

In some embodiments, the method 200 continues with optional operation 240. At operation 240, the substrate is pretreated by exposing the substrate to a nitrogen treatment. In some embodiments, the nitrogen treatment comprises one or more of nitrogen radicals, nitrogen ions or thermal ammonia. In some embodiments, the nitrogen radicals and/or the nitrogen ions may be generated by a remote plasma source (RPS). In some embodiments, the nitrogen radicals and/or the nitrogen ions may be generated as a direct plasma.

The method continues at operation 250 by simultaneously exposing the substrate to at least three reactants for a period of time. The at least three reactants are each present simultaneously in a reaction space above the substrate 100. Accordingly, the three reactants each react with each other in the gas phase as well as any material(s) deposited on the substrate.

A first reactant 252 comprises a tungsten halide. In some embodiments, the tungsten halide comprises one or more of $WCl_6$ or $WF_6$. In some embodiments, the tungsten halide consists essentially of $WF_6$.

A second reactant 254 comprises a molybdenum halide. In some embodiments, the molybdenum halide comprises one or more of $MoCl_6$ or $MoFe$. In some embodiments, the molybdenum halide consists essentially of $MoFe$.

In some embodiments, each of the tungsten halide and the molybdenum halide have the general formula of MXs, where M is the metal and X is a halogen. In some embodiments, the each of the halogens is the same halogen. In some embodiments, the tungsten halide and the molybdenum halide comprise the same halogen atom. In some embodiments, each of the halogen atoms in the tungsten halide and the molybdenum halide are the same halogen.

A third reactant 256 comprises a reductant. In some embodiments, the reductant comprises $H_2$. In some embodiments, the reductant consists essentially of $H_2$.

The first reactant 252, the second reactant 254 and the third reactant 256 are each independently flowed into the reaction space above the substrate at a flow rate. The partial pressure of each reactant is directly related to the flow rate of each reactant.

In some embodiments, the flow rate of the tungsten halide is in a range of 300 sccm to 1500 sccm. In some embodiments, the flow rate of the tungsten halide is 500 sccm.

In some embodiments, the flow rate of the molybdenum halide is in a range of 0.1 sccm to 15 sccm, or in a range of 0.1 sccm to 100 sccm. In some embodiments, the flow rate of the molybdenum halide is less than or equal to 50 sccm, less than or equal to 10 sccm, less than or equal to 5 sccm, or less than or equal to 1 sccm. In some embodiments, the flow rate of the molybdenum halide is 10 sccm.

In some embodiments, the flow rate of the reductant is in a range of 3500 sccm to 16 slm. In some embodiments, the flow rate of the reductant is 5000 sccm.

In some embodiments, a ratio between the flow rate of the tungsten halide and the flow rate of the molybdenum halide is controlled. The inventors have surprisingly found that the inclusion of the molybdenum halide in a tungsten CVD process can provide control over the deposition rate of the tungsten. In some embodiments, the flow rate of the molybdenum halide is increased to decrease the deposition of tungsten. In some embodiments, the flow rate of the molybdenum halide is increased to prevent the deposition on tungsten. In some embodiments, the ratio of the flow rate of $WF_6$:$MoF_6$ is greater than or equal to 5:1, greater than or equal to 20:1, or greater than or equal to 50:1. In some embodiments, the ratio of the flow rate of $WF_6$:$MoF_6$ is less than or equal to 100:1.

The period of exposure may be selected to provide a predetermined volume or thickness of the tungsten gapfill. In some embodiments, the period of exposure to provide the predetermined volume or thickness may be known from previous experience. In some embodiments, the period of exposure is 40 seconds.

The substrate and/or the reaction space above the substrate may be maintained at any suitable temperature during operation 250. In some embodiments, the temperature is maintained in a range of 350° C. to 550° C. In some embodiments, the temperature is maintained at 450° C.

The processing pressure of the reaction space above the substrate may be maintained at any suitable pressure during operation 250. In some embodiments, the processing pressure is maintained in a range of 3 Torr to 90 Torr. In some embodiments, the processing pressure is maintained at 5 Torr.

In addition to adding the molybdenum halide, the deposition rate of the tungsten CVD process can also be controlled by modifying the temperature and/or pressure of the reaction. In some embodiments, the deposition rate of a tungsten CVD process is reduced by adding the molybdenum halide and decreasing the temperature. In some embodiments, the deposition rate of a tungsten CVD process is reduced by adding the molybdenum halide and decreasing the pressure.

The inventors have also surprisingly found that the deposition rate of a tungsten CVD process can be reduced by adding a molybdenum halide and reducing the partial pressure and/or flow rate of the reductant.

In some embodiments, the operation 250 may be stopped and decision point 260 made by determining if the predetermined volume or thickness of the tungsten gapfill has been formed. If it has, the method 200 continues to operation 270 for optional post processing. If it has not, the method 200 returns to 250 for continued formation of the tungsten gapfill. The optional post-processing at operation 270 can be, for example, a process to modify film properties (e.g., annealing, plasma treatment) or a further film deposition process (e.g., additional ALD or CVD processes) to grow additional films.

Figure 3:
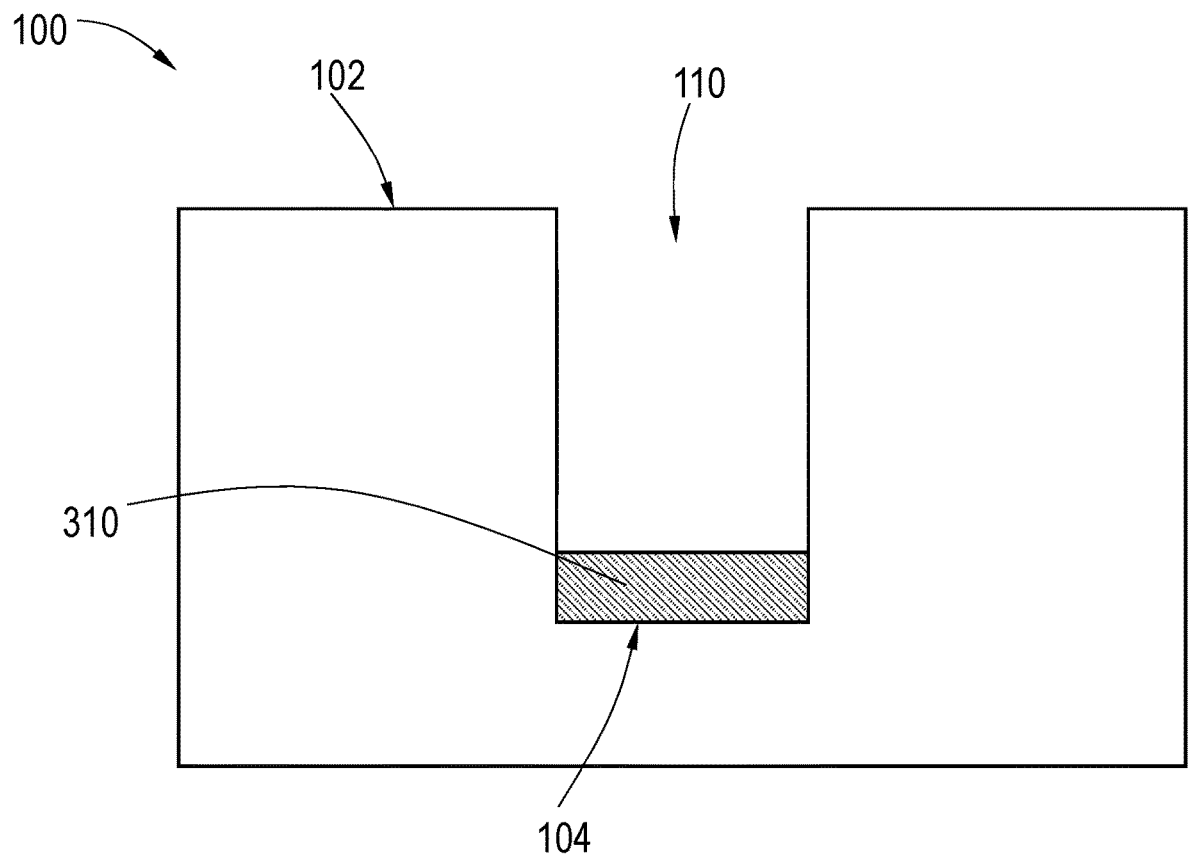
FIG. 3 shows a cross-sectional view of an exemplary substrate after deposition of a bottom up tungsten gapfill according to one or more embodiment of the disclosure.

Referring to FIG. 3, the method 200 provides a bottom-up tungsten gapfill 310 within the feature. Specifically, the tungsten gapfill 310 is formed on the bottom 104 of the feature 110. In some embodiments, no substantial deposition of the tungsten gapfill 310 is observed on the top surface 102 of the substrate 100. As used in this regard, "no substantial deposition" is defined as little to no deposition on the top surface 102. Stated differently, the thickness of tungsten deposited on the top surface 102 is less than 5%, less than 2%, less than 1% or less than 0.5% of the thickness of tungsten deposited at the bottom 104 of the feature 110.

The method 200 forms the tungsten gapfill 310 on the bottom 104 of the feature 110. As the tungsten gapfill is deposited additional tungsten gapfill is deposited on the existing gapfill near the bottom of the feature 110. In this way, the method 200 can be described as a bottom-up gapfill method, depositing material at the bottom of the feature 110 and filling the feature 110 from the bottom towards the top surface 102.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming bottom-up tungsten gapfill, the method comprising simultaneously exposing a substrate with a feature therein to flows of a tungsten halide, a molybdenum halide and a reductant, the tungsten halide comprising $WF_6$ and the molybdenum halide comprising $MoF_6$, and a ratio of a flow rate of $WF_6$:$MoF_6$ is in a range of 5:1 to 100:1, the feature defined by a depth from a top surface of the substrate to a bottom and width between two sidewalls, wherein tungsten is formed on the bottom without substantial deposition on the top surface of the substrate.

2. The method of claim 1, wherein the feature has an aspect ratio of greater than or equal to 20:1.

3. The method of claim 1, wherein the tungsten halide and the molybdenum halide comprise the same halogen.

4. The method of claim 1, wherein the reductant comprises $H_2$.

5. The method of claim 1, wherein the substrate is maintained at a temperature in a range of 350° C. to 550° C.

6. The method of claim 1, wherein a processing pressure is maintained in a range of 3 Torr to 90 Torr.

7. The method of claim 1, wherein the feature is lined with a barrier layer.

8. The method of claim 7, wherein the barrier layer comprises TiN.

9. The method of claim 1, wherein the tungsten gapfill is formed on a nucleation layer.

10. The method of claim 9, wherein the nucleation layer is deposited by sequentially exposing the feature to $WF_6$ and a reductant comprising one or more of $B_2H_6$, $SiH_4$ or $H_2$.

11. The method of claim 1, further comprising exposing the substrate to a nitrogen-treatment before forming the forming the tungsten gapfill.

12. The method of claim 11, wherein the nitrogen treatment comprises one or more of nitrogen radicals, nitrogen ions or thermal ammonia.

* * * * *

UNITED STATES PATENT AND TRADEMARK OFFICE
CERTIFICATE OF CORRECTION

PATENT NO. : 12,014,956 B2
APPLICATION NO. : 17/488275
DATED : June 18, 2024
INVENTOR(S) : Xi Cen et al.

It is certified that error appears in the above-identified patent and that said Letters Patent is hereby corrected as shown below:

In the Specification

•Column 4, Line 40, replace "MoFe" after "$MoCl_6$ or" and before ". In some embodiments," with "$MoF_6$".

•Column 4, Line 41, replace "MoFe" after "essentially of" with "$MoF_6$".

•Column 4, Line 43, replace "MXs" after "general formula of" with "$MX_6$".

Signed and Sealed this
Sixth Day of August, 2024

Katherine Kelly Vidal
Director of the United States Patent and Trademark Office